United States Patent [19]

Michener

[11] Patent Number: 4,852,035
[45] Date of Patent: Jul. 25, 1989

[54] SIMPLE COEFFICIENT HALF-BANDWIDTH DIGITAL FILTER FOR VIDEO DATA COMPRESSION

[75] Inventor: James A. Michener, Grass Valley, Calif.

[73] Assignee: The Grass Valley Group, Inc., Grass Valley, Calif.

[21] Appl. No.: 70,287

[22] Filed: Jul. 6, 1987

[51] Int. Cl.[4] .............................................. G06F 7/38
[52] U.S. Cl. ............................ 364/724.10; 364/724.13
[58] Field of Search ................... 364/724, 723, 724.10, 364/724.13, 724.01

[56] References Cited

U.S. PATENT DOCUMENTS

| | | | |
|---|---|---|---|
| 4,344,149 | 8/1982 | Van de Meeberg et al. | 364/724 |
| 4,356,559 | 10/1982 | Candy et al. | 364/724 |
| 4,460,890 | 7/1984 | Bushy | 340/347 DD |
| 4,612,625 | 9/1986 | Bertrand | 364/724.1 |
| 4,691,293 | 9/1987 | Conboy | 364/724 |
| 4,701,956 | 10/1987 | Katoh | 381/61 |
| 4,725,972 | 2/1988 | Göckler | 364/724.1 |
| 4,777,612 | 10/1988 | Tomimitsu | 364/724.13 |

Primary Examiner—Gary V. Harkcom
Assistant Examiner—Tan V. Mai
Attorney, Agent, or Firm—Francis I. Gray

[57] ABSTRACT

A digital data rate compression system accepts an input digital signal having a plurality of samples at a given rate and outputs a digital signal at one-half of the given rate, or as an expansion system outputs a digital signal at twice the given rate. The digital data rate reduction technique uses multi-rate digital filtering in the form of a half bandwidth filter. In the case of the digital filter the input digital signal is separated into even and odd samples which are input to separate delay lines at one-half the given rate. The even samples are summed in pairs symmetrically about the center of the even delay line, and each pair is weighted according to a modified sin(x)/x function with simple coefficients which may be accomplished by additions and shifts, to eliminate the need for multipliers. For data rate reduction the even sample pairs from the even delay line and the odd samples from the odd sample delay line are combined to form an average of the even samples and the odd samples which is the coded digital signal at one-half the given rate. For data rate expansion a multiplexer may be used to combine the even and odd samples to produce an output digital signal at twice the given rate to decode the coded digital signal.

8 Claims, 9 Drawing Sheets

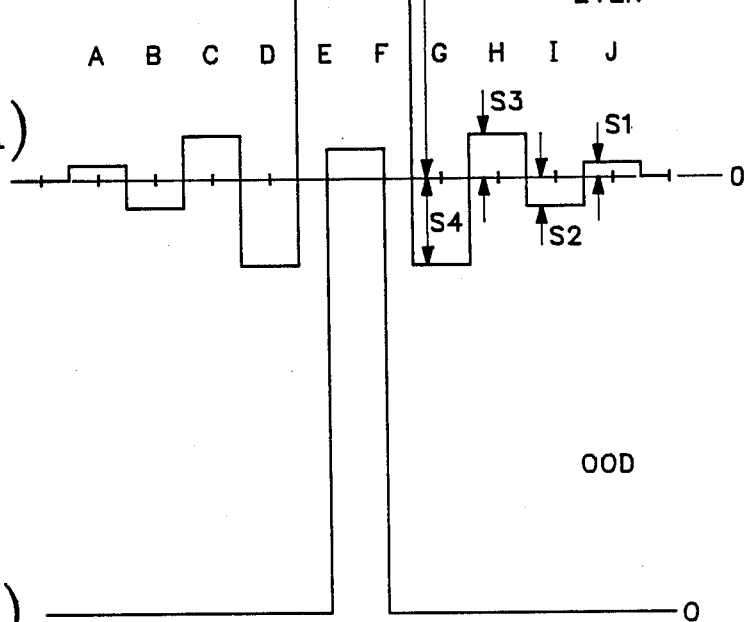
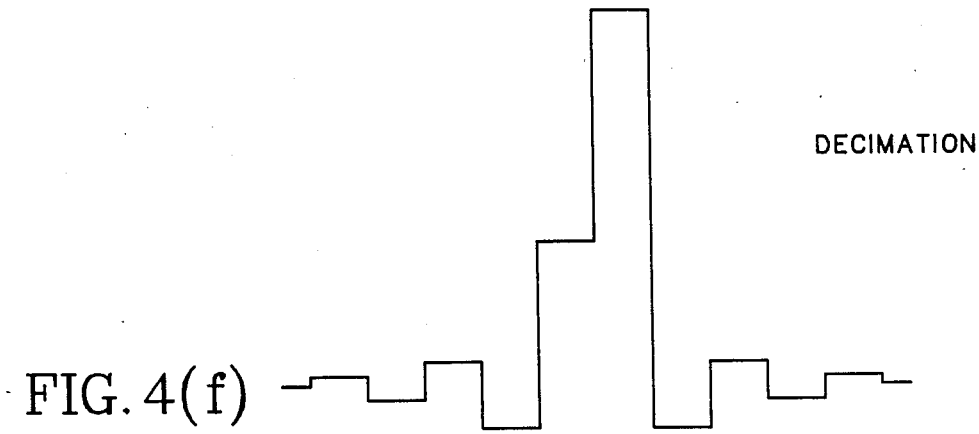

FIG. 4(b) ⎍⎍⎍⎍⎍⎍⎍⎍⎍⎍⎍⎍⎍⎍⎍⎍ CLK

FIG. 4(c) ⎍⎍⎍⎍⎍⎍⎍⎍ 1/2 CLK

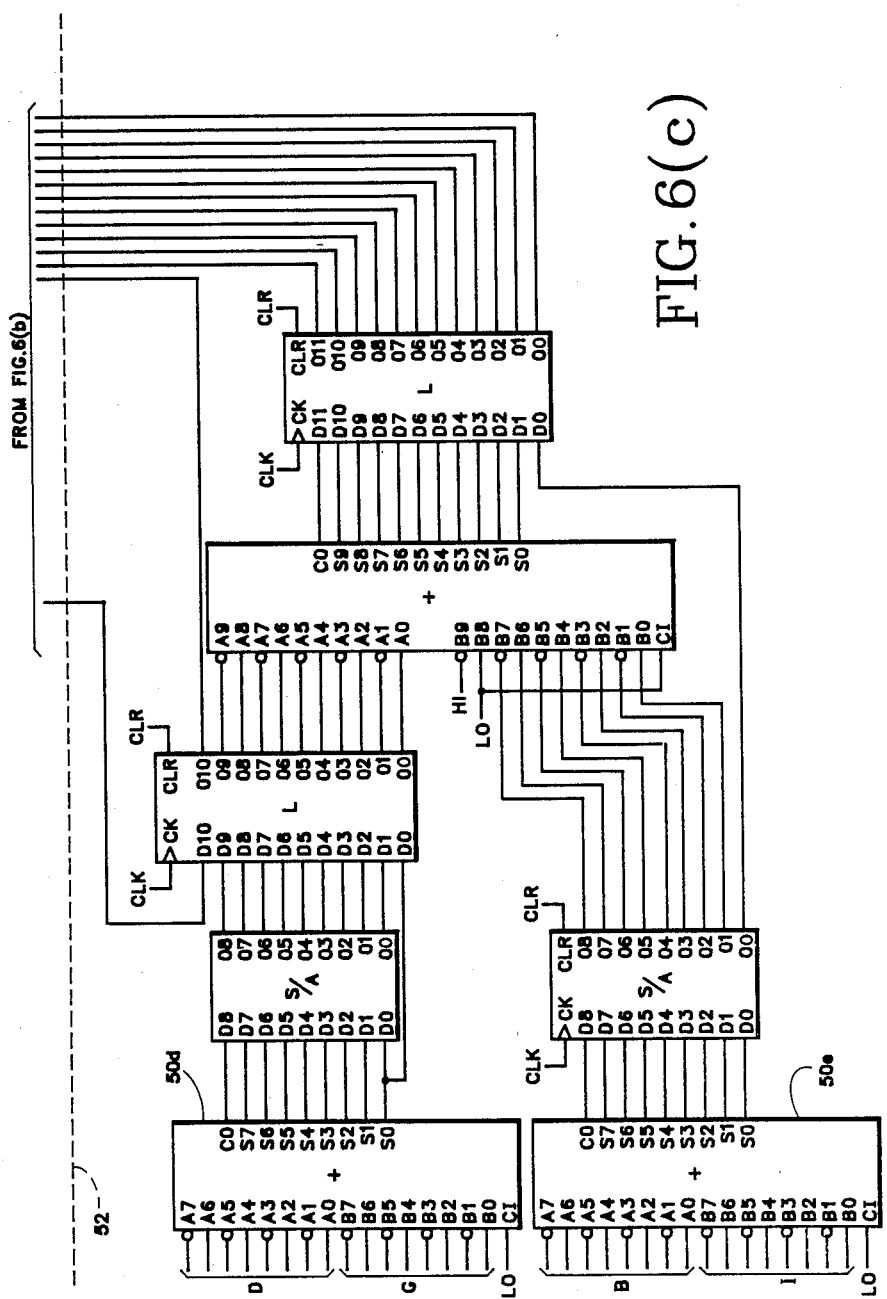

SIMPLE COEFFICIENT HALF-BANDWIDTH DIGITAL FILTER FOR VIDEO DATA COMPRESSION

BACKGROUND OF THE INVENTION

The present invention relates to digital data filtering, and more particularly to a simple coefficient half-bandwidth digital filter which provides digital data rate compression.

In the quest for data rate reduction of a digital signal for transmission, the lowest possible sampling frequency should be employed prior to any other algorithm. This rate was defined by H. Nyquist of Bell Laboratories as twice the highest expected frequency. The problems associated with sampling at the Nyquist rate, i.e., 8.5–9.0 MHz for video data where the highest expected frequency is 4.2 MHz, are well understood. Anti-aliasing filtering of the input signal is difficult for linear phase and step attenuation characteristics to be achieved. As a practical matter the Nyquist sampling rate is extremely difficult to achieve. Prior analog anti-aliasing filters have inherent well-known problems and have a lowest practical sampling rate of four times the video subcarrier frequency, with sampling rates of as low as three times video subcarrier frequency being accomplishable at the expense of extremely complex circuitry. Likewise digital filtering has been perceived as being too complex. Digital finite impulse response (FIR) filters process a signal along a multi-element delay line, multiplying the output of each element by a weighting factor and summing all the weighted outputs together to produce an output signal.

What is desired is a digital data rate compression system which is simple and provides a lower sample rate than prior systems.

SUMMARY OF THE INVENTION

Accordingly the present invention provides a simple coefficient half-bandwidth digital filter using digital data rate compression to decimate digital input data and interpolate digital output data. analog input data is digitized and sampled at a given rate at least twice the Nyquist sampling rate, such as five times the subcarrier frequency for a television system, in an analog-to-digital converter. The odd and even samples are clocked through separate multi-element delay lines at one-half the analog-to-digital conversion rate. The even samples are summed in pairs symmetrically about the center element of the even delay line and then weighted using simple shifts and adds. The summed and weighted even sample pairs are then added together and to the odd samples at the output of the odd delay line to provide a decimated output digital signal that approaches the Nyquist sampling rate limit. Alternatively the odd and even outputs are multiplexed together to provide an interpolated output digital signal at the original sampling rate.

The objects, advantages and novel features of the present invention will be apparent from the following detailed description when read in conjunction with the appended claims and attached drawing.

BRIEF DESCRIPTION OF THE DRAWING

FIGS. 4a–4g provide a pictorial view of the functioning of the simple coefficient half-bandwidth digital filter as an interpolator (FIG. 4g) and as a decimator (FIG. 4f).

FIGS. 6a–6c are a schematic diagram view of a weighting delay line for the simple coefficient half-bandwidth digital filter according to the present invention.

DESCRIPTION OF THE PREFERRED EMBODIMENT

Figure 1:
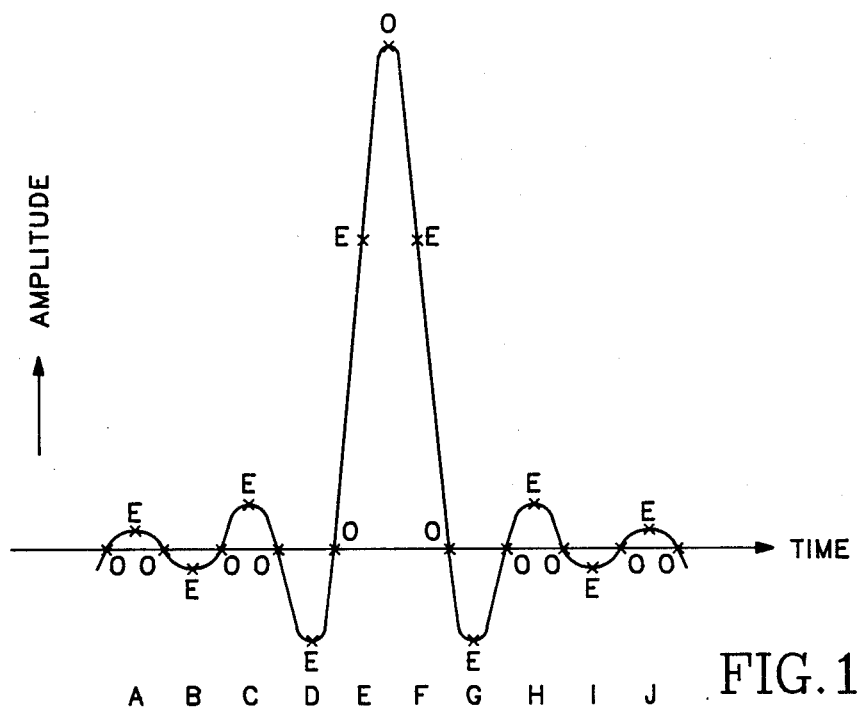
FIG. 1 is a time domain view of the output from an ideal linear phase analog lowpass filter in response to a pulse input.
Figure 2:
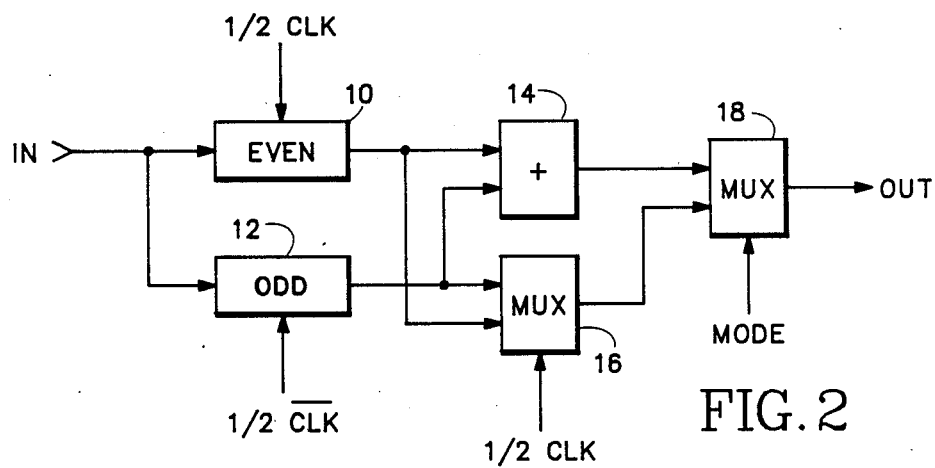
FIG. 2 is a block diagram view of a simple coefficient half-bandwidth digital filter using digital data rate compression according to the present invention.

Referring now to FIG. 1 a time domain response of an ideal linear phase analog lowpass filter to a pulsed input is shown as a sin(x)/x curve. As is apparent, if the output of the filter is sampled at the proper times to form a half-bandwidth filter, the odd samples O are maximum at the center and zero everywhere else. The even samples E have some value, either positive or negative, which is less than the maximum value. Also the output is symmetrical about the center maximum. A finite impulse response digital filter seeks to replicate the response of the analog filter as indicated previously by weighting the various samples. However as shown in FIG. 2 a half-bandwidth filter using data rate compression according to the present invention has as an input a digitized signal consisting of a plurality of sequential samples. Alternate samples are clocked into alternate delay lines, an even delay line 10 and an odd delay line 12. Using the nomenclature of Fig. 1 the samples in the even delay line 10 are weighted by summing symmetrical pairs and shifting and adding each resulting summed pair. The odd delay line 12 is shorter than the even delay line 10 since all the values except one are zero. The outputs of the delay lines 10, 12 are input to an output summer/shifter 14 and an interpolation multiplexer 16. The outputs of the summer/shifter 14 and multiplexer 16 are input to a final multiplexer 18, the output of which is the filtered input.

Figure 3:
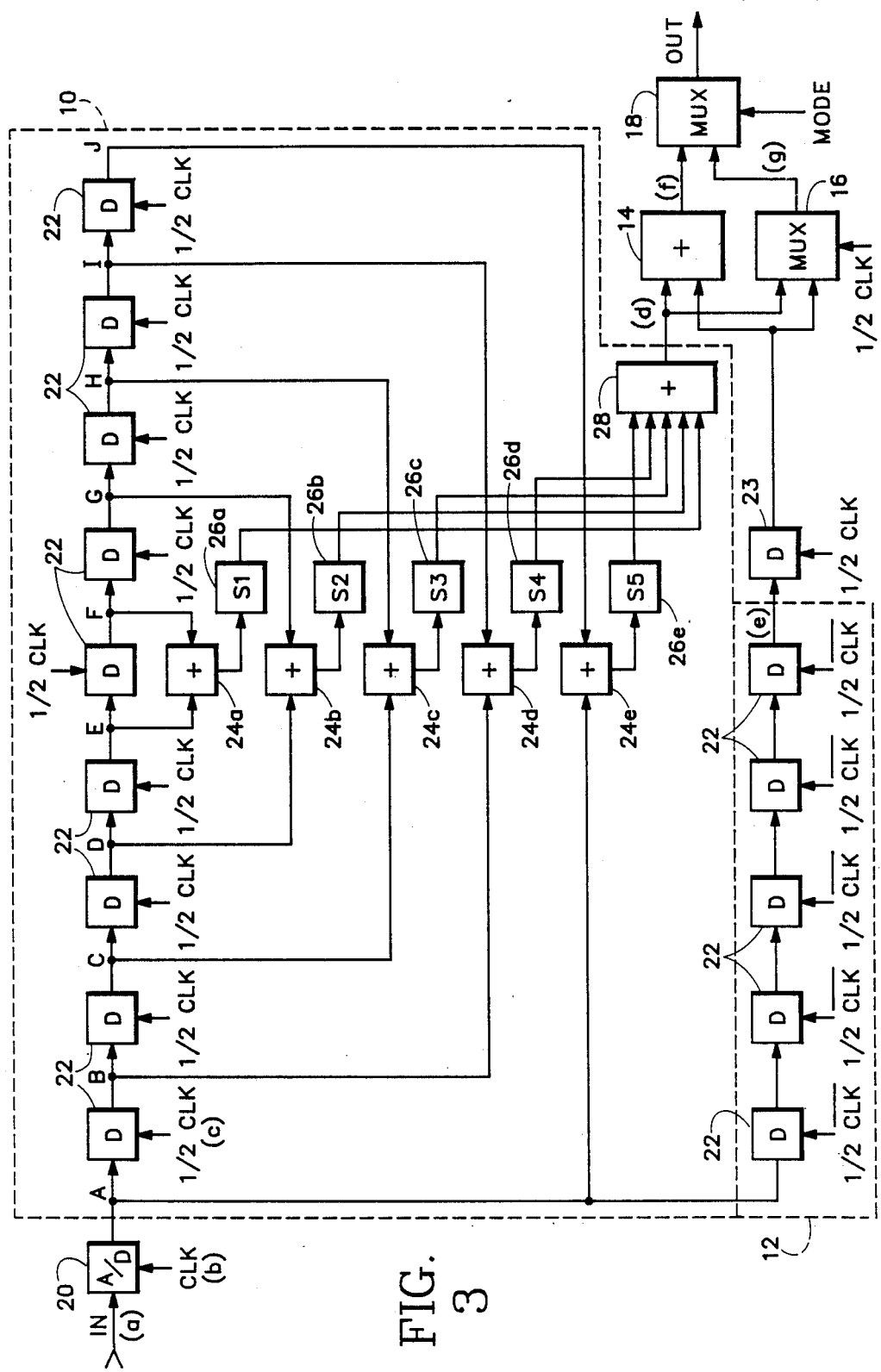
FIG. 3 is a detailed block diagram view of the simple coefficient half-bandwidth digital filter of FIG. 2.

FIG. 3 shows in greater detail the half-bandwidth digital filter. An input video signal is sampled by an analog to digital (A/D) converter 20 at a frequency CLK well above the Nyquist limit, which frequency is an integer multiple of a characteristic frequency of the video signal, such as five times the video subcarrier frequency for a television video system. The data is clocked out of the A/D converter 20 in such a manner that the even samples and the odd samples are split and travel along two different paths by a clock ½ CLK which is one-half the sampling rate, the even samples being input to the even sample delay line 10 and the odd samples being input to the odd sample delay line 12. In this manner all the samples are processed, but the data rate through each path is one-half that of the A/D sampling frequency. Each delay line 10, 12 has a plurality of delay elements 22, which may be simple data latches. The number of delay elements 22 in the odd delay line 12 is less than that in the even delay line 10 so that the delayed odd samples are appropriately combined with the even samples. The samples from each delay element 22 of the even delay line 10 together with the input sample, indicated by nodes A-J, form symmetrical pairs of data. Each symmetrical pair, i.e., A/J, B/I, C/H, D/G and E/F, are input to respective adders 24a-24e. The output of the adders 24a-24e are weighted by respective weighting circuits 26a-26e. The outputs of all the weighting circuits 26a-26e are summed in a master summing circuit 28 to provide the even samples output. A latch 23 at the output of the odd delay line 12 serves to synchronize the odd output with the even output. The even and odd delay line outputs are then combined as described above with respect to FIG. 2.

For illustration purposes FIGS. 4a-4g demonstrate how an input pulse (a) is processed by the half-bandwidth digital filter. The sampling clock CLK (b) and the process clock ½ CLK (c) are shown, which clocks provide the timing for the filter. Since the input data samples occur at CLK rate, it is apparent that, if the data samples are clocked out of the A/D converter 20 on alternate transitions of ½ CLK, all of the data samples from the A/D converter will be processed. The output (d) of the even delay line 10 shows transitions corresponding to the leading edge of ½ CLK, while the output (e) of the odd delay line 12 shows transitions corresponding to the trailing edge of ½ CLK. Comparing the outputs (d), (e) with the idealized analog filter response characteristic of FIG. 1, a correlation between the digital response and the analog response is apparent. The decimation output (f) from the summer/shifter 14 is the averaged sum of the outputs (d), (e) from the delay lines with the odd delay line output (d) being shifted one-half clock cycle by latch 23. The interpolation output (g) from the interpolation multiplexer 16 shows that when ½ CLK is positive, the even delay line output (d) is seen at the output and, when ½ CLK is negative, the odd delay line output (e) is seen at the multiplexer output to produce an output at CLK rate. The operation of the one-half bandwidth filter is illustrated with respect to a single pulse input (a) for ease of understanding.

A practical implementation of a codec (coder/decoder) using the simple coefficient half-bandwidth digital filter is shown schematically in FIGS. 5a-5b and 6a-6c. The digital data from the A/D converter 20 is clocked into an A/D output latch 30 at the sampling rate FCLK, such as five times subcarrier frequency for a television video system. The data from the A/D output latch 30 is clocked into the odd delay line 12 on the negative edge of a one-half rate clock /CLK and is clocked into the even delay line 10 on the positive edge of the one-half rate clock CLK. The odd delay line 12 has a plurality of latches connected in series which serve as the delay devices 22. The latches 22 in the odd delay line 12 are clocked on /CLK and the output latch 23 is clocked on CLK to synchronize odd delay line output with the output from the even delay line 10. The outputs of the odd delay line 12 and the even delay line 10 are input to the adder 14, the output of which is one-half of the sum of the inputs to provide the last weighting factors to the even and odd samples. The output of the adder 14 is input via an overshoot clipper 32 in the form of a plurality of paralleled OR gates having CMD as one input and the respective input lines as the other input to an output latch 34. The output of the output latch 34 is the data compressed signal at one-half the sampling rate. The data compressed, or decimated, signal is input to the output multiplexer 18.

The output of the odd delay line 12 is also input to an interpolation latch 36, the output of which is input to one side of the interpolation multiplexer 16. A portion of the output of the even delay line 10 is input via a second overshoot clipper 38 to the other side of the interpolation multiplexer 16. A NAND gate 40 is enabled by a filter enable signal FILTER. The output of the NAND gate 40 is connected to the select input of the interpolation multiplexer 16 so that, when the /CLK signal is applied to the NAND gate, the output of the interpolation multiplexer switches between the output of the odd delay line 12 and the output of the even delay line 10 to produce an interpolated signal at the sampling rate. The interpolated signal is input to the other side of the output multiplexer 18. The output of the output multiplexer 18 is determined by the output of an AND gate 42 which is connected to the select input of the output multiplexer. The AND gate 42 is enabled by FILTER, and the output state is determined by the state of the command input MODE. One state of MODE passes the decimated signal through the output multiplexer 18, and the opposite state of MODE passes the interpolated signal through the output multiplexer.

Figure 6A:
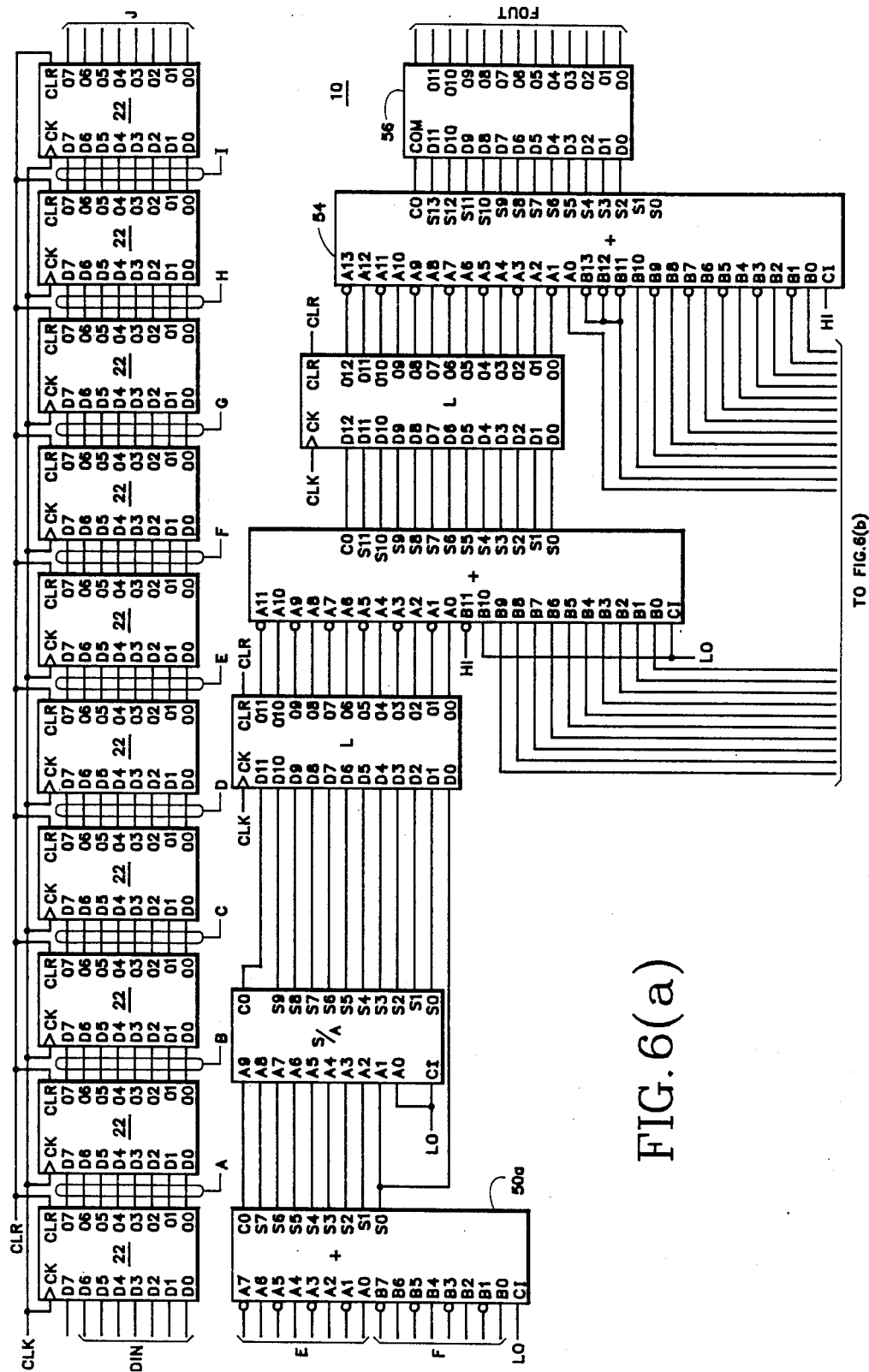
Figure 6B:
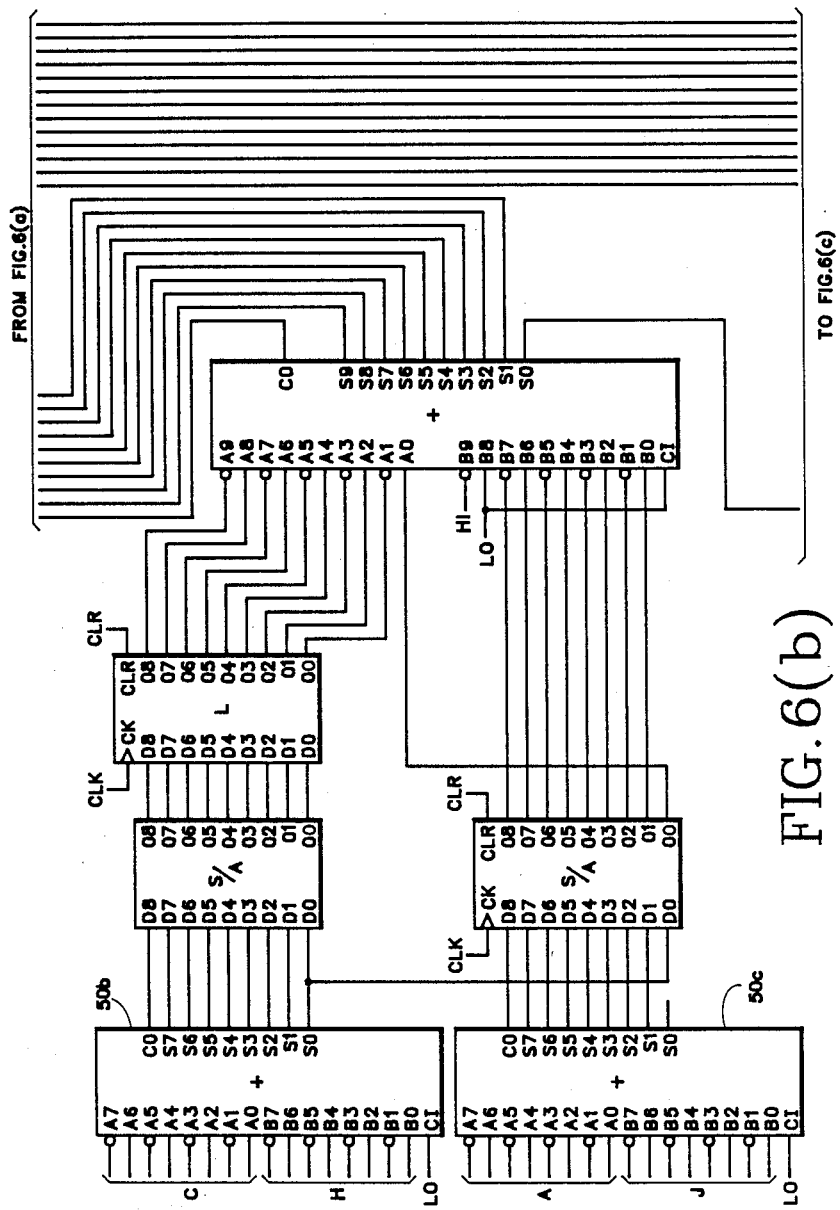

The data DIN from the A/D output latch 30 is input to the even delay line 10 of the half-bandwidth filter as shown in FIG. 6a. The latches, or delay devices 22, that make up the even delay line 10 are clocked by CLK, and the outputs at nodes A-J of the latches are combined as described below. The filter design of the half-bandwidth filter is simplified by using weighting which is accomplished by simple shifts and adds, and it is optimized for a minimum number of adders as opposed to optimizing for a given filter function. The symmetric samples from A-J are added in respective sample adders 50a-50e as shown in FIGS. 6a-6c. The components which have positive weighting factors, E/F, C/H and A/J, are combined via appropriate adders, latches and shift/adders above the dotted line 52 and input to an output adder 54. The components which have negative weighting factors, D/G and B/I, are combined via appropriate adders, latches and shift/adders below the dotted line 52 and input to the output adder 54. The output adder 54 is configured as a subtractor by having a high input HI on the carry-in line CI so that the weighted values of D/G and B/I are subtracted from the weighted values of E/F, C/H and A/J. The output of the output adder 54 is clipped by an undershoot clipper 56 in the form of a plurality of AND gates having CMD as one input and the respective input lines as the other input. The effective weights given to each sample pair for one embodiment are given in Table 1 as follows:

TABLE 1

| Sample Pair | Weight |
|---|---|
| EVEN: | |
| E/F | 20/32 |
| C/H | 3/32 |
| A/J | 1/32 |
| D/G | −6/32 |
| B/I | −2/32 |
| EVEN Total: | ½ |
| ODD Total: | ½ |
| Total: | 1.0 |

Figure 7A:
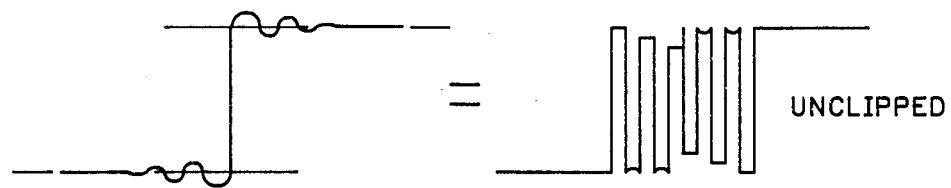
FIGS. 7a and 7b are an illustrative view of overshoot and undershoot clipping provided by the simple coefficient half-bandwidth digital filter of the present invention.
Figure 7B:
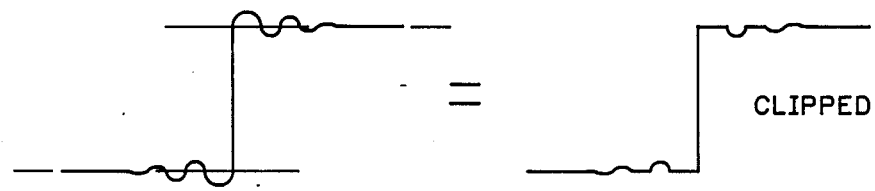
Figure 4G:
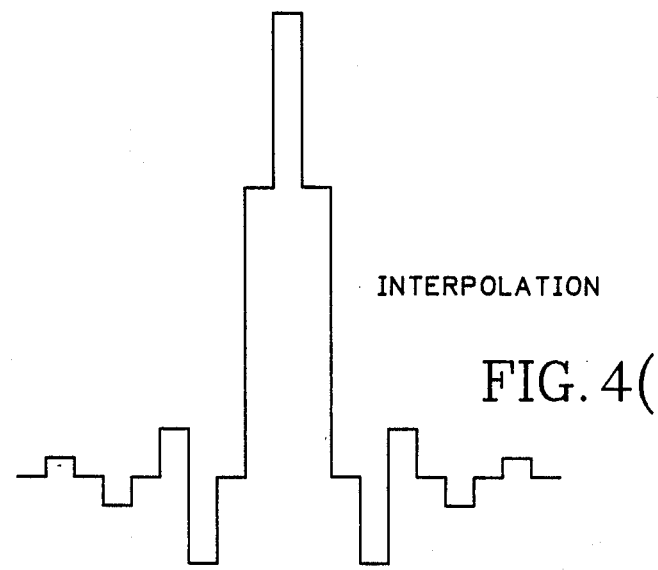
Figure 5A:
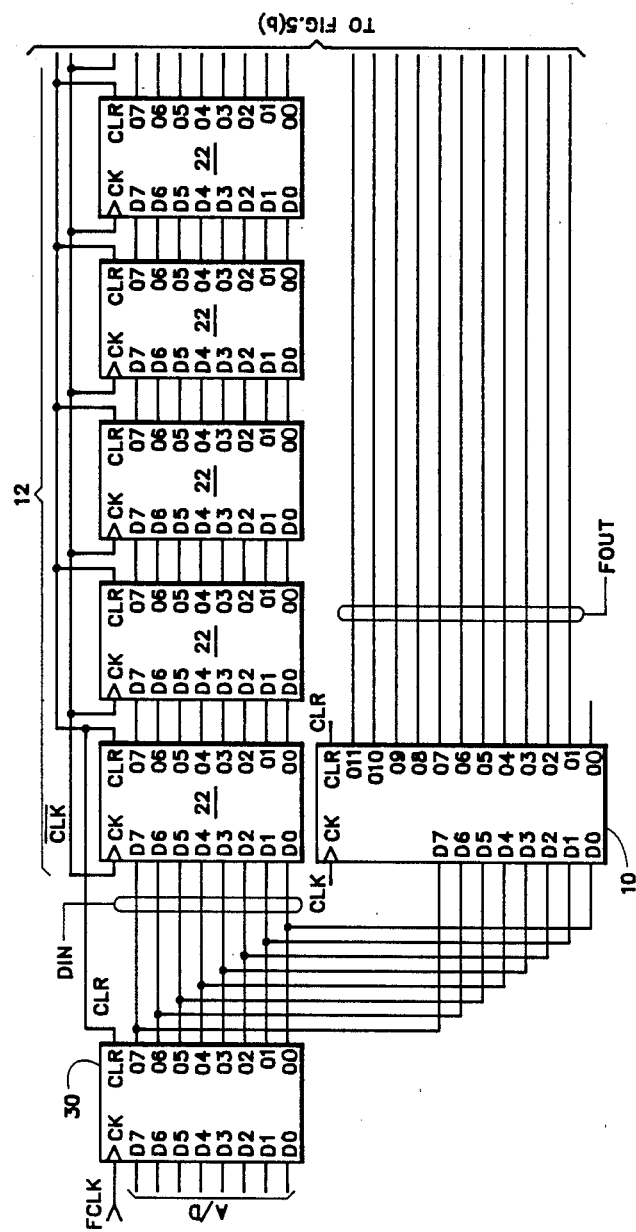
FIGS. 5a and 5b are a schematic diagram view for the simple coefficient half-bandwidth digital filter of FIG. 3 according to the present invention.
Figure 5B:
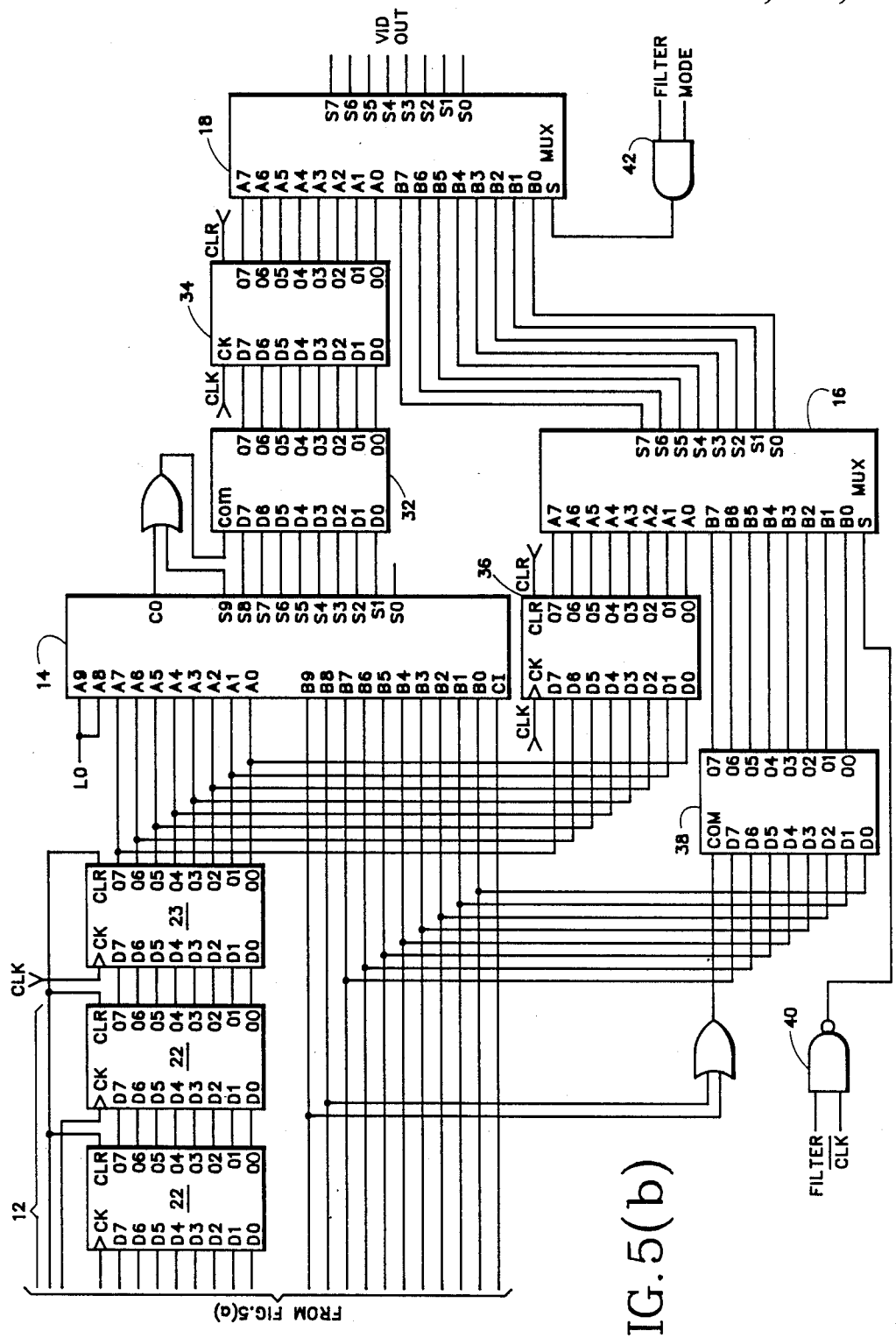

As shown in FIGS. 7a and 7b the response of a filter results in overshoot/undershoot at the transitions of a pulse. If this effect is not taken into consideration, the resulting digital output of the filter for the large amplitude pulse will be as shown in (a) as the overshoot/undershoot causes a digital wraparound. Therefore, the clippers 32, 38 and 56 provide a means for eliminating this wraparound problem by commanding the output of the clippers to be all "1"s where overshoot is detected and all "0"s where undershoot is detected, respectively, based upon the fact that the carryover or excess most significant bit from the previous stage will be a "1" when such a condition exists. The resulting output using the clippers 32, 38 and 56 is shown at (b) with the overshoot/undershoot essentially eliminated.

Thus the present invention provides a digital data rate compression system for encoding and decoding digital data, such as video data, which samples at a first frequency and uses a half-bandwidth digital filter to weight the samples to produce an output data rate one-half of the sample rate.

What is claimed is:

1. A half-bandwidth digital filter comprising:
    means for sampling an input signal at a given rate that is an integer multiple of a characteristic frequency of the input signal; and
    means for processing the samples of the input signal at a processing rate one-half of the given rate to produce a filtered output digital signal, the processing rate being near the Nyquist frequency for the input signal and the processing means providing a weighted average of the samples of the input signal using simple coefficients that require only shifting and adding functions.

2. A half-bandwidth digital filter as recited in claim 1 further comprising means for providing from the filtered output digital signal a decimated digital output at one-half the given rate.

3. A half-bandwidth digital filter as recited in claim 2 further comprising means for providing from the filtered output digital signal an interpolated digital output at the given rate.

4. A half-bandwidth digital filter as recited in claim 3 further comprising means for selecting between the decimated digital output and the interpolated digital output to provide the filtered output digital signal.

5. A half-bandwidth digital filter comprising:
    means for separating a digital input signal sampled at a given rate into two data paths processed at one-half the given rate, one of the data paths processing odd samples of the digital input signal and the other processing even samples of the digital input signal;
    means for combining the samples along one of the data paths with appropriate weighting coefficients to achieve a given filter function, the weighting coefficients being such that only shifting and adding of the samples is required; and
    means for recombining the outputs of the two data paths to produce a filtered digital output signal.

6. A half-bandwidth digital filter as recited in claim 5 wherein the recombining means comprises:
    means for summing the outputs of the two data paths to produce a decimated digital output at one-half the given rate;
    means for multiplexing the outputs of the two data paths to produce an interpolated digital output a the given rate; and
    means for selecting between the decimated digital output and the interpolated digital output to produce the filtered digital output signal.

7. A half-bandwidth digital filter as recited in claim 5 wherein the combining means comprises:
    means for summing symmetrical pairs of the samples;
    means for weighting each summed symmetrical pair with the appropriate weighting coefficient by shifting and addition; and
    means for adding the weighted, summed symmetrical pairs together to produce an output for the one data path for recombining with the output of the other data path.

8. A half-bandwidth digital filter as recited in claim 7 wherein each data path comprises a plurality of delay devices, the one data path having a greater number of delay devices than the other data path, the outputs of each delay device of the one data path forming the symmetrical pairs about a designated middle delay device.

* * * * *